(12) United States Patent
Duval (10) Patent No.: US 6,843,308 B1
(45) Date of Patent: Jan. 18, 2005

(54) HEAT EXCHANGER DEVICE USING A TWO-PHASE ACTIVE FLUID, AND A METHOD OF MANUFACTURING SUCH A DEVICE

(75) Inventor: Jean Duval, Le Kremlin Bicetre (FR)

(73) Assignee: Atmostat Etudes et Recherches, Villejuif (FR)

( * ) Notice: Subject to any disclaimer, the term of this patent is extended or adjusted under 35 U.S.C. 154(b) by 0 days.

(21) Appl. No.: 10/855,259

(22) Filed: May 26, 2004

Related U.S. Application Data (63) Continuation-in-part of application No. 09/647,420, filed as application No. PCT/FR99/00722 on Mar. 29, 1999, now abandoned.

(51) Int. Cl.[7] ............................................... F28D 15/00
(52) U.S. Cl. .................. 165/104.26; 165/185; 165/80.4; 165/170; 361/700; 257/715; 174/15.1; 174/15.2; 428/166; 428/188; 428/178
(58) Field of Search ........................... 165/104.26, 905, 165/166, 170, 146, 185, 80.4, 104.33; 361/699, 700; 257/714–716; 174/15.1, 15.2; 29/890.03; 428/166, 188, 178

(56) References Cited

U.S. PATENT DOCUMENTS

| | | | |
|---|---|---|---|
| 3,703,758 A | * | 11/1972 | Beck, Jr. ..................... 29/202 |
| 4,019,098 A | * | 4/1977 | McCready et al. ......... 361/700 |
| 4,186,796 A | | 2/1980 | Usui |
| 4,315,498 A | | 2/1982 | Devin et al. |
| 4,327,370 A | * | 4/1982 | Kessler et al. ................ 357/79 |
| 4,516,632 A | * | 5/1985 | Swift et al. .................. 165/167 |
| 4,602,679 A | | 7/1986 | Edelstein et al. |
| 4,685,512 A | | 8/1987 | Edelstein et al. |
| 4,727,454 A | * | 2/1988 | Neidig et al. ............... 361/382 |
| 4,805,691 A | * | 2/1989 | Cook et al. ............ 165/104.33 |
| 5,117,648 A | * | 6/1992 | Kowalski et al. .......... 62/238.6 |
| 5,168,921 A | | 12/1992 | Meyer, IV |
| 5,179,043 A | * | 1/1993 | Weichold et al. ........... 437/225 |
| 5,219,020 A | | 6/1993 | Akachi |

(List continued on next page.)

FOREIGN PATENT DOCUMENTS

| | | |
|---|---|---|
| DE | 19626227 | 1/1998 |
| EP | 198126 | 10/1986 |
| EP | 217777 | 9/1987 |
| EP | 438938 | 7/1991 |
| EP | 529837 | 3/1993 |
| EP | 753713 A2 | 1/1997 |
| FR | 2454064 | 11/1980 |
| FR | 2599131 | 11/1987 |
| FR | 2669719 | 5/1992 |
| FR | 2686151 | 7/1993 |
| FR | 2735565 | 12/1996 |
| FR | 2752291 | 2/1998 |
| RU | 1108324 | 8/1984 |
| RU | 1341487 | 9/1987 |
| WO | WO 98/22767 | * 11/1996 |
| WO | WO 98/22767 | 5/1998 |

*Primary Examiner*—Terrell McKinnon
(74) *Attorney, Agent, or Firm*—Blakely Sokoloff Taylor & Zafman (57) ABSTRACT

A flat sheet structured thermal device using a two-phase active fluid. The device including at least a top sheet, at least two intermediary sheets, and a back sheet stacked longitudinally. Each intermediary sheet has at least one zone etched through its entire thickness to form a gas transport channel. The etched zone being longitudinally bordered by at least one groove formed on the same sheet. The at least one groove contributing to the formation of at least one capillary channel when the sheet is covered by another sheet. The capillary channel is of a section adapted to enable the liquid phase of the fluid to be pumped therein by capillary forces. The device allows fluid to pass reversibly between the capillary channel and the gas transport channel during the liquid/gas or gas/liquid transition due to temperature variations to which at least one zone of the device is subjected.

22 Claims, 10 Drawing Sheets

U.S. PATENT DOCUMENTS

| | | | |
|---|---|---|---|
| 5,225,935 A | * 7/1993 | Watanabe et al. | 359/619 |
| 5,309,457 A | 5/1994 | Minch | |
| 5,380,956 A | * 1/1995 | Loo et al. | 174/252 |
| 5,458,189 A | 10/1995 | Larson et al. | |
| 5,548,605 A | * 8/1996 | Benett et al. | 372/36 |
| 5,697,428 A | 12/1997 | Akachi | |
| 6,003,591 A | * 12/1999 | Campbell | 165/104.26 |
| 6,058,711 A | 5/2000 | Maciaszek et al. | |
| 6,167,948 B1 | 1/2001 | Thomas | |
| 6,365,260 B1 | 4/2002 | Stecher et al. | |
| 6,437,981 B1 | * 8/2002 | Newton et al. | 361/700 |

* cited by examiner

FIG_1

FIG_2

/ : Heat flux

FIG_13

→ : Heat flux

FIG_14

FIG_15

US 6,843,308 B1

HEAT EXCHANGER DEVICE USING A TWO-PHASE ACTIVE FLUID, AND A METHOD OF MANUFACTURING SUCH A DEVICE

This application is a Continuation-in-Part of U.S. patent application Ser. No. 09/647,420 filed on Dec. 1, 2000, now abandoned, which claims priority under 35 U.S.C. § 371 to PCT/FR99/00722 filed on Mar. 29, 1999.

BACKGROUND OF THE INVENTION

1. Field of the Invention

The present invention relates to the field of active fluid heat exchanger devices, and more precisely to those which contain a two-phase fluid and which include capillary channels.

2. Description of the Related Art

The term "two-phase" means that the fluid contained in such devices is present in the form of two phases, a liquid and a gas, in order to enable such devices to operate.

The term "capillary" is used below to mean channels of section that is very small relative to their length, and above all which are suitable for producing pumping phenomena by capillarity on liquids.

Two-phase fluid heat exchanger devices are already known that have capillary channels suitable for producing phenomena of capillarity on the liquid phase, and having gas transport channels in which the gas phase of the fluid is confined, the capillary channels communicating with the gas transport channels.

Such devices are used either as closed-loop devices or as open-loop devices.

In closed-loop operation, the device is used as a heat pipe and it functions in self-contained manner. In that application, the device is exposed to a cold zone for condensation, also known as a "cold source", and to a hot zone for vaporization, also known as a "hot source". The fluid condenses into its liquid phase in the cold zone and it is vaporized into its gas phase in the hot zone. Capillary forces act on the liquid phase of the fluid to move it from the condensation zone to the vaporization zone. Since gas pressure is higher in the vaporization zone than in the condensation zone, a flow of gas is obtained in the direction opposite to the movement of the liquid phase. The capillary and pressure forces on their own act to drive fluid circulation.

In open-loop operation, the device is used as an evaporator, and a pump and a condenser are integrated in the circuit. For the device to be operational, the fluid must arrive in liquid form in the device and leave it in gas form to be condensed in some other element of the circuit. In the presence of gravity forces, it suffices to orient the device appropriately in order to conserve the liquid in a liquid arrival zone in the device, given that liquid is denser than gas and cannot move away via the gas circuit downstream from the device. However, in the absence of gravity forces, the liquid takes up the form of droplets dispersed in the gas phase. The capillary channels then serve to fix the droplets and to prevent them moving away along the gas circuit downstream from the device.

In such applications, devices of a first type are already in use which are constituted by cylindrical rods of circular section stacked in a hexagonal array perpendicularly to their long direction. When stacked in this way, the rods define cavities between one another. These cavities extend longitudinally parallel to the rods and present a cross-section that is roughly triangular. These cavities contain the two-phase fluid. Those portions of the outside surfaces of the rods that are situated in the vicinity of the apexes of the triangles, i.e. close to the contact zones between pairs of rods, constitute channels suitable for exerting capillary forces on the liquid phase of the fluid. The central zone of each cavity forms a gas transport channel. In order to enable that type of device to operate properly, it is essential for there to be no interruption of the capillary channels along their length. This requires the cylindrical rods to be stacked accurately and rigidly. The rods are therefore received and held in grooves formed in a rigid and rectilinear bar. A device of that type is relatively expensive to make and presents drawbacks in certain applications. For example, its rigidity constitutes one of its drawbacks since that is poorly compatible with allowing pieces to which it is fixed to move when such pieces are subjected to stresses. In addition, when such a device is used as a heat pipe, its performance depends on its capacity to transport heat by means of the fluid. Fluid displacement in the heat pipe is driven by capillary forces exerted on the liquid phase of the fluid as contained in the capillary channels. However, in devices of that type, a large amount of volume is occupied by the cylindrical rods themselves. Consequently, the number of capillary channels for any given volume is relatively small, thus limiting the performance of such devices. This lack of compactness does not provide for good integration with electronic circuits to which the device is fitted.

By way of example, document FR 2 735 565 discloses another type of device. A device of this other type is constituted by aluminum tubes that are internally fluted to form capillary channels that open out to a hollow central region that serves as a gas transport channel. In that case also, the cylindrical shape of the tubes does not favor optimum compactness or performance.

Proposals have also been made, for example in document U.S. Pat. No. 5,697,428, for a device in which a continuous furrow is etched in a first metal plate. The furrow has rectilinear portions that are parallel to one another and that are interconnected by curved portions, the overall shape being zigzag. A second metal plate is placed on the first plate so as to close the furrow and form a tube. In such a structure, the zones where the fluid is in its liquid phase and those where the fluid is in its gas phase follow one another along the path of the fluid in the tube. The inside dimensions of the tube remain the same in all of the zones where the fluid moves. That device therefore cannot optimize the circulation of each phase of the fluid independently. In particular capillary pumping is not achieved and, in that case, the term "capillary" relates essentially to the shape of the tube whose cross-section is very small compared to its length, thereby enabling the gas to remain in the form of bubbles in the liquid and to push it.

SUMMARY OF THE INVENTION

An object of the invention is to provide a thermal device using a two-phase active fluid, which device is flat and flexible, presents high degrees of compactness and performance, and includes in its thickness at least one channel of section that is large enough to enable a gas to pass easily without being obstructed by a liquid, and also at least one channel that is small enough to enable a liquid to propagate therein by capillarity. Another object of the invention is also to provide a device that presents little risk of ceasing to operate due to the capillary channels drying out locally.

These objects are achieved by a thermal device using a two-phase active fluid, the device comprising at least one capillary channel and at least one gas transport channel, each capillary channel being of a section adapted to enable the liquid phase of the fluid to be pumped therein by capillary forces, each gas transport channel having a section greater than that of a capillary channel, said device allowing fluid to pass reversibly between at least one capillary channel and at least one gas transport channel during the liquid/gas or gas/liquid transition due to temperature variations to which at least one zone of the device is subjected, the device being characterized in that it comprises at least one sheet having on one of its two main faces at least two parallel grooves that communicate longitudinally with one another, and at least one sheet suitable for covering the grooves so as to form at least one capillary channel and at least one gas transport channel.

Thus, a device of the invention has a sheet structure which enables it to be flat. This shape also makes it possible to have large contact areas between the device and the structures which are fitted with the device. Heat exchange between the device and such structures is facilitated thereby.

Preferably each sheet of the flat device according to the invention has a thickness which is less or equal to 500 $\mu$m, a length which is superior or equal to 50 times its thickness and a width which is superior or equal to 20 times its thickness. Therefore, in one embodiment, the device according to the present invention, has a thickness which is between 1 and 2 mm. Preferably, the device according to the present invention has a length which is between 50 and 200 mm. In another embodiment according to the invention, the device has a width which is between 10 and 30 mm. Therefore, the device according to the present invention has a flat structure.

This structure also makes it possible to optimize capillary pumping and gas flow in rational manner.

In this device, the capillary channel is made "flat", by forming a groove in a sheet, prior to being integrated in the bulk of the device. As a result, it is possible to optimize its dimension perpendicular to the main surface of the sheet into which the capillary-constituting groove opens out. This dimension is referred to as the "thickness" of the capillary channel and it can be as small as needed. Capillary pressure tends towards a maximum when the thickness of the capillary channel tends towards zero, and it is only "flat" implementation that makes it possible to obtain the few microns ($\mu$m) or tens of microns that are required in order to be able to lift liquid through a great height.

Advantageously, to obtain high capillary pressure, the thickness of the capillary channel is less than 100 $\mu$m. More preferably, the thickness of the capillary channel lies in the range 30 $\mu$m to 70 $\mu$m approximately.

Furthermore, the dimension parallel to the main surface of the sheet determines the "width" of the capillary channel. It is the width of the capillary channel that determines its head loss and that thus makes it possible to obtain the liquid flow rate required. The "flat" disposition makes it possible to increase this width as much as necessary and thus makes it possible to obtain a large flow rate and large thermal power.

A capillary channel is preferably about 0.3 millimeters (mm) to 1 mm wide for a satisfactory flow rate and limited head loss. In prior art heat pipes, wetting heat pipes are of large section but very low capillary pressure, thereby making it impossible to use the heat pipe when it is inclined. For wick heat pipes or old fashioned micro-heat pipes, the section in which the thickness of the capillary is optimal is of very narrow width.

The section of each gas transport channel is determined in terms of thickness by the number of sheets that are stacked together and by the thickness of each sheet, and in terms of width by the width of the corresponding groove, which is etched through the entire thickness of each sheet. This section is large enough to reduce the speed of the gas and allow flow to take place with low head loss. This serves to avoid the performance of the micro-heat pipe be limited by the gas reaching the speed of sound in the gas transport channels.

In addition, in the device of the invention, the grooves are formed directly in the sheets. A rigid structure is therefore not needed, unlike prior art devices in which cylindrical rods are stacked. The thickness and the nature of the material used for the sheets can therefore be selected so as to confer flexibility to the device. The fact that it is possible to select sheets that are thin also makes it possible to improve compactness and to optimize the ratio of heat transport capacity over device size so as to obtain high performance. At given power, the device of the invention is of much smaller thickness than traditional heat pipes, typically one-third to one-fifth the thickness, thereby giving considerable potential for reducing weight. Because of its very small thickness, the device of the invention can also be deformed easily, thus authorizing bends with a very small radius of curvature, coming close to folding. This facility makes it possible to generate contact surfaces that are not plane, in particular surfaces that are cylindrical, and to generate changes of plane by changing altitude or angular direction, or indeed to generate "bellows" type shapes enabling flexible connections to be made with heat sinks.

It is also necessary to optimize the transfer of gas between the capillary channels and the gas transport channels in order to avoid drying out, amongst other things. In prior art heat pipes, relying on surface wetting or on wicks, this transfer is permanent insofar as both types of channel are integrated one in the other. However, when attempting to improve prior art heat pipes, the goal of achieving high capillary pumping performance has led to the capillary channel being isolated, which means that gas must circulate in the capillary, thus favoring drying out. The device of the invention makes it possible simultaneously to optimize transfer between capillary channels and gas transport channels, and to optimize capillary pumping performance.

Thus, a device of the invention can have a plurality of capillary channels that communicate longitudinally with a gas transport channel. In this way, if local heating should dry out one of the capillary channels, another of these channels can continue to circulate the liquid phase. In addition, communication between capillary channels and gas channels over their entire length makes it possible to avoid restricting transfer zones between these two types of channel, and makes it possible to obtain proper closed-loop operation regardless of the respective dimensions of the vaporization and condensation zones.

Advantageously, the number of sheets the device of the invention comprises that are stacked on one another is equal to or greater than two, each sheet having at least one groove suitable for forming a gas transport channel communicating over its entire length with a corresponding groove in another sheet.

Also advantageously, the device of the invention comprises at least one circuit of channels operating in a closed circuit and, without requiring a motor, serving to circulate the fluid contained in the circuit between an evaporation zone and a condensation zone, the capillary forces exerted on the liquid phase of the fluid contained in the capillary channels acting as a pump on the fluid. In which case, the device of the invention constitutes a heat pipe. Such a heat pipe can be made up of a plurality of sheet subassemblies, each subassembly comprising a channel circuit that is isolated from the circuit of each other subassembly, each circuit being filled with a fluid whose thermodynamic properties enable the fluid to operate over different temperature ranges.

However, in another embodiment, the device of the invention comprises at least one channel circuit that is open to a circuit having a pump and a condenser, the device of the invention then acting as an evaporator and the capillary forces exerted on the liquid phase of the fluid enabling the fluid to be fixed in the capillary channels, and enabling it to be distributed in these channels by capillary pumping.

Furthermore, heat transfer must be optimized in order to avoid temperature gradients in hot and cold transfer zones. In an advantageous variant of the device of the invention, this quality of heat transfer is optimized by having ends of a special shape. A "staircase" disposition of the liquid-gas boundaries serves to spread out the meniscuses of these surfaces, thereby enhancing heat exchange.

In another aspect, the invention provides a method of making devices of the invention.

In the method, the main operations of building the device of the invention are cutting out and etching the sheets, bonding them together flat, in a press, and blocking out. This makes it possible to provide a large number of pieces simultaneously, which favors mass production. This is not possible with traditional heat pipes which need to be machined one by one.

The cutting-out and flat-etching work done on the sheets makes it possible for the device of the invention to have very great freedom in design at low cost, and facilitates interconnecting ducts constituted by a gas transport channel and the capillary channels associated therewith. This feature is particularly remarkable in that the etching and the cutting out are performed simultaneously everywhere over an entire sheet. The corresponding cost is therefore not proportional to the length required for the ducts.

BRIEF DESCRIPTION OF THE DRAWINGS

Other aspects, objects, and advantages of the invention will appear on reading the following detailed description. The invention will also be better understood with the help of references to the drawings, in which:

FIG. 6a shows such a stack on a scale that is greatly expanded in the direction perpendicular to the plane of the sheets; FIG. 6b shows the section of a gas transport channel and the adjacent association capillary channels in greater detail;

DETAILED DESCRIPTION

Figure 1:
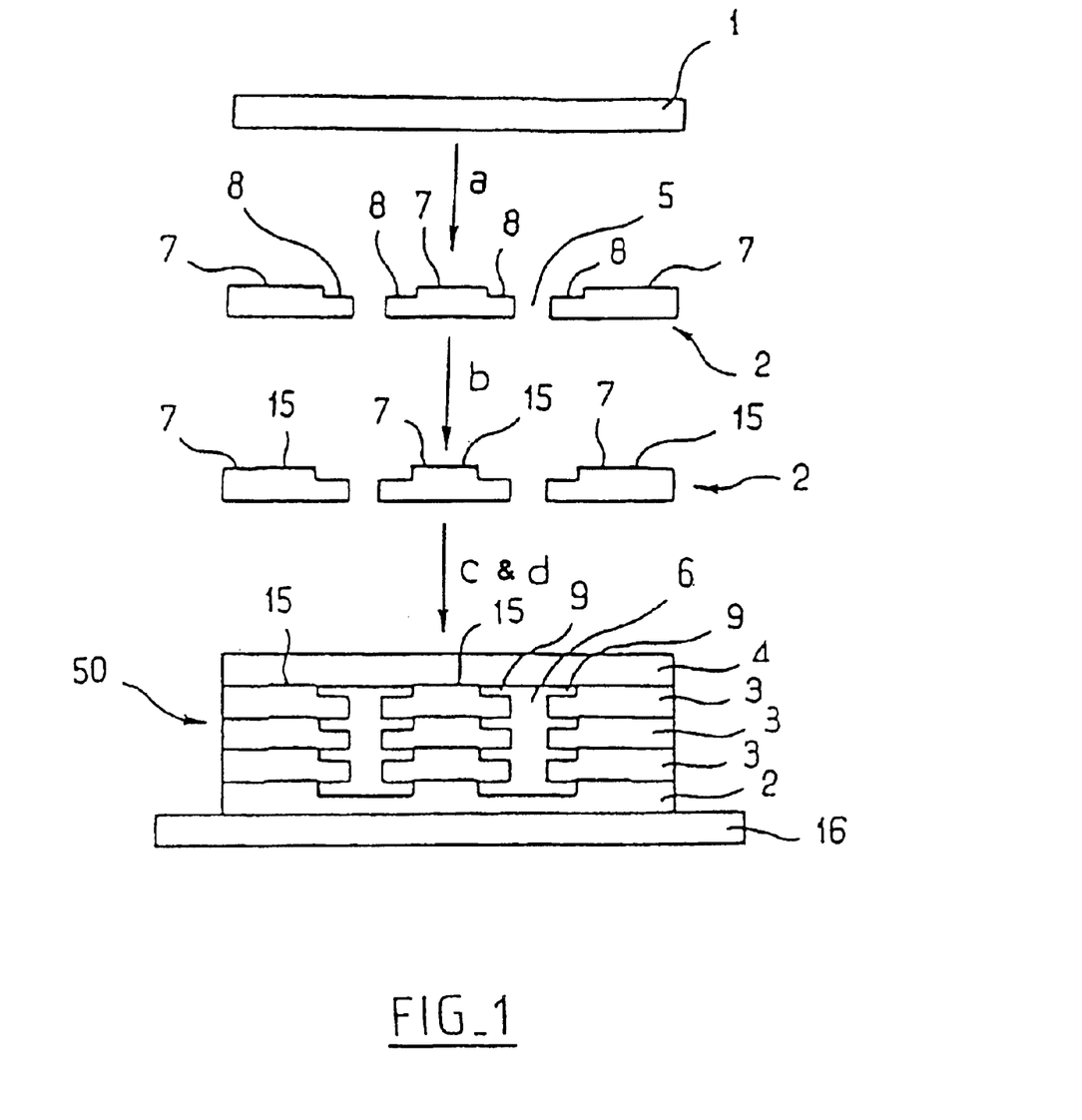
FIG. 1 is a diagram of the steps in a nonlimiting implementation of the method of making a device of the invention.

Preferably, but in non-limiting manner, a device of the invention can be made using the method illustrated in FIG. 1.

This method comprises a step a of etching grooves in blank sheets 1, a step b of localized deposition of a bonding material, a step c in which sheets previously prepared in steps a, and b are stacked, and an assembly step d for bonding together the set of sheets stacked in step c so as to form a heat pipe 50, for example.

A blank sheet 1 is constituted by a plate whose thickness preferably lies in the range 1.0 mm to 1 mm. By way of example, the material from which the sheets are made can be a metal. This metal can be copper, nickel, iron, aluminum, or indeed an alloy thereof, such as beryllium aluminum or stainless steel. The nature of the metal constituting the sheets depends on the active fluid used.

Several types of sheet are needed to make a heat pipe 50 of the invention. Starting from a blank sheet 1, it is possible to fabricate bottom sheets 2, intermediate sheets 3, and top sheets 4.

The etching step a is preferably a chemical etching step with a blanking mask. The mask defines the groove zones to be etched. These grooves are etched differently in the bottom sheets 2, in the intermediate sheets 3, and in the top sheets 4. This cutting-out step a can be implemented as a plurality of successive operations making it possible selectively to etch firstly zones S that are etched through the entire thickness of a sheet, and secondly zones that are etched over smaller thickness.

Thus, zones 5 etched through the entire thickness of the sheets are to form gas transport channels 6. Zones etched over a smaller thickness form a step between a first level 7 situated at the top surface of each sheet, and a second level 8. This step is for the purpose of forming capillary channels 9. The chemical etching baths used are adapted to the nature of the sheet material and are conventional and known to the person skilled in the art.

The etched zones between the first and second levels 7 and 8 are preferably made parallel to the zones 5 etched through the entire thickness and extend along the entire length thereof. These zones etched down to the second level 8 are situated on at least one edge of each zone 5 etched through the entire thickness so that ongoing transversely relative to the long direction of the channels 6, 9, one passes from the first level 7 to the second level 8, and then into the zone 5 that is etched through the entire thickness without going back up to the first level 7.

Holes 10 and notches 11 can optionally also be etched in the sheets respectively for receiving pegs 12 and pips 13 or plugs 14 (these elements are not shown in FIG. 1). Holes 10 and notches 11 are shown in FIGS. 2 to 5.

Figure 2:
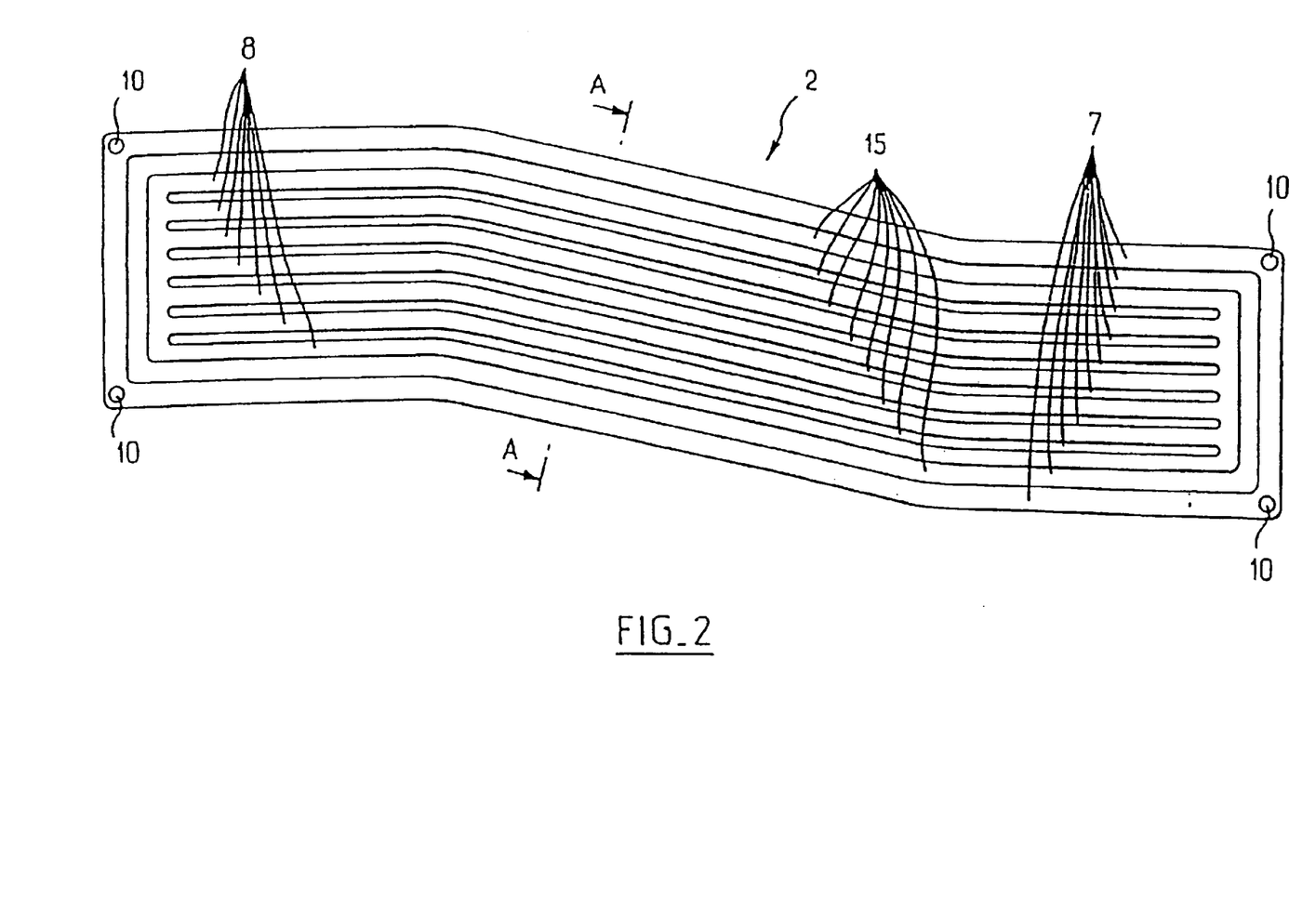
FIG. 2 is an elevation view of the top of a bottom sheet in an embodiment of a device of the present invention.
Figure 4:
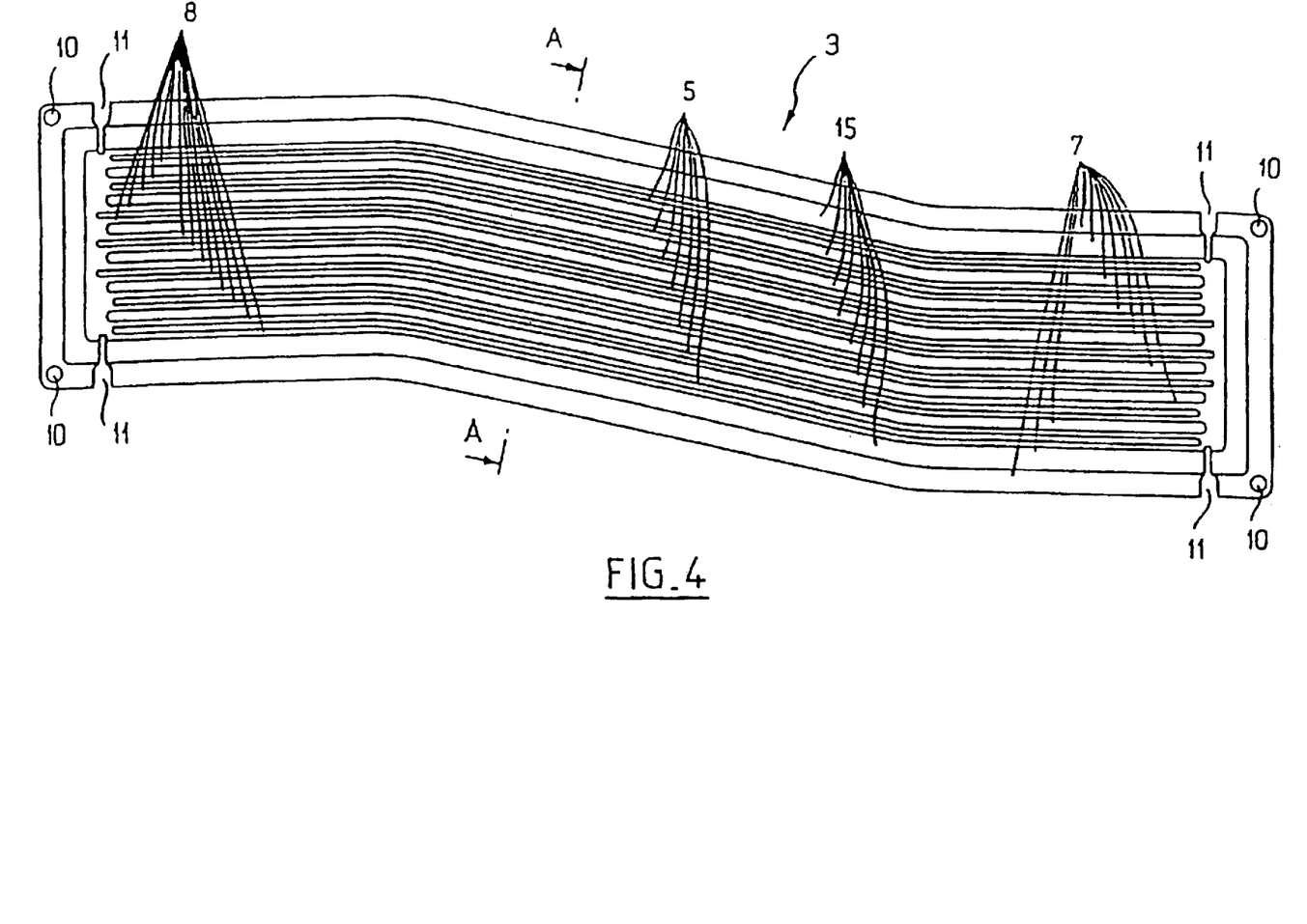
FIG. 4 is an elevation view of the top of an intermediate sheet of the device of the invention corresponding to the same embodiment as that of FIG. 2.

The step b of depositing a bonding material is performed along strips arranged to enable the sheets 2, 3, 4 to be assembled together in leakproof manner with the gas channels 6 being separated from one another longitudinally while maintaining communication between the gas channels 6 at the ends thereof. When the sheets 2, 3, and 4 are made of metal, this assembly material is preferably also a metal. Advantageously, this metal is deposited by electrotyping to have a shape that is defined by a mask. The metal deposited in this way is adapted to match the intended type of bonding d. The metal 15 deposited can differ depending on whether the subsequent bonding step d is performed, for example, by compression while hot or by soldering. The metal is also selected as a function of the material used for the sheets 2, 3, and 4. Thus, when the assembly step d is performed by soldering, the deposited metal must have a melting point that is lower than that of the metal constituting the sheets 2, 3, and 4. With sheets 2, 3, and 4 made of copper, it is possible to use gold and silver for diffusion soldering. With sheets 2, 3, and 4 made of stainless steel, it is possible to use nickel and gold for diffusion soldering. The nature of the metal deposited also depends on the active fluid used. For example, when "Freon" is used as the active fluid, the metal deposited can be of copper or silver. The thickness of the metal deposited typically lies in the range 5 $\mu$m to 10 $\mu$m. The metal 15 is deposited on the top faces of the sheets around the unit constituted by a zone 5 etched through the entire thickness and at least one capillary channel 9, and on either side of said unit (FIGS. 2 and 4). The metal 15 is also deposited around the periphery of the sheets (FIGS. 2 and 4). The metal is deposited in small quantities to ensure that, during bonding, it does not fill up the zones that are intended to form the capillary channels 9. Typically, the thickness of the metal deposit 15 is 5 $\mu$m to 10 $\mu$m.

Figure 7:
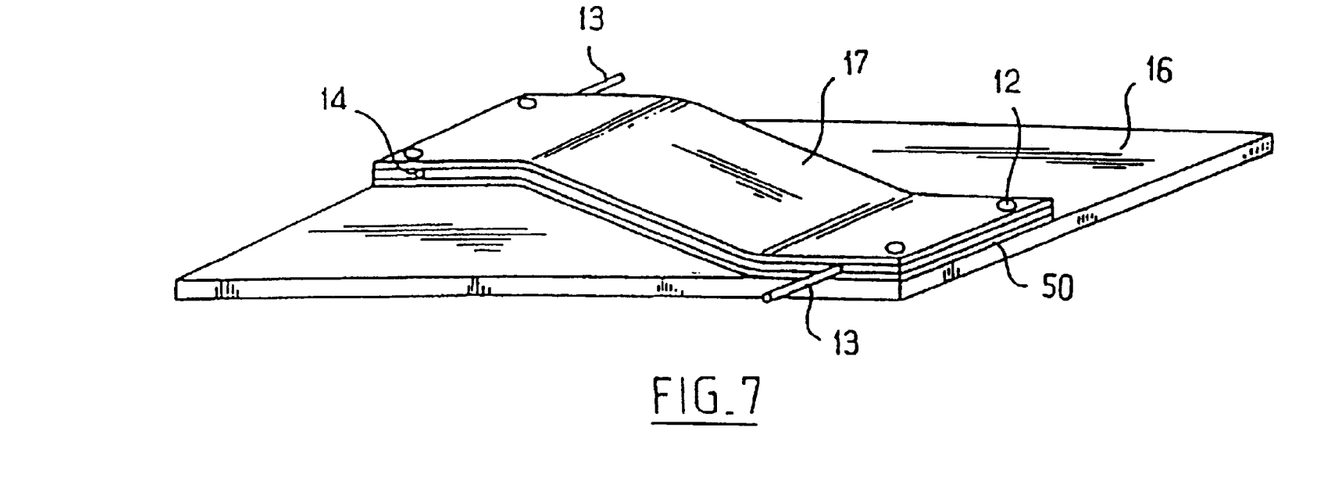
FIG. 7 is a diagrammatic perspective view of an embodiment of the device of the invention, resting on an assembly jig.

By way of example, the step c of stacking the sheets as previously prepared in steps a and b is performed by placing three intermediate sheets 3 in succession vertically onto a bottom sheet 2 followed by a top sheet 4 on the top intermediate sheet 3. In step c, the sheets 2, 3, and 4 are stacked so that they present the zones that are etched down to the second level 8 facing upwards. The zones 5 etched through the entire thickness are placed in register with one another and define the gas transport channels 6. When the zones etched to the second level 8 are covered by the sheet immediately above them, they constitute capillary channels 9. The stack of sheets 2, 3, and 4 defines a heat pipe 50. As shown in FIG. 7, to make the stack, it is also possible to rest the heat pipe 50 on a support 16 (a jig) and to cover it all with a sheet 17 for isolating the heat pipe 50 from the weights necessary for stacking. Pegs 12 are optionally placed in the holes 10 so as to keep the sheets in accurate alignment during the subsequent bonding step d.

The bonding step d is preferably performed by soldering. In this way, the solder forms a liquid phase which wets the zones on which it has been deposited and the zones of the adjacent sheet facing them. This serves to bond together the sheets which have been pressed against one another to ensure that they are in contact. Such soldering can be performed under a vacuum ($10^{-5}$ millibars (mbar)) or under a gaseous atmosphere, but preferably under an atmosphere that is not oxidizing. A sublayer is optionally deposited between the sheet and the solder. The sheets are thus joined together in leakproof manner around each of the sheets and between each of the units constituted by a gas transport channel and at least one capillary channel.

Pips 13 and plugs 14 are placed in the orifices made by superposing the notches 11.

The two-phase fluid is injected into the evaporator via the pips 13 before they are closed.

The fluid used depends on the intended operating temperature range. It can be $H_2O$, $NH3$, acetone, "Freon", methane, ethane, etc.

Numerous variants of the above-described method can be envisaged. Thus, for example, the method described above has a bonding step d which is performed by soldering. It could also be performed by compression while hot. Under such circumstances, it is preferably performed under a vacuum to avoid surface passivation by fixing non-metallic compounds ($O_2$, $N_2H_2O$, volatile fats, etc.). The temperature of the compression while hot is situated at about 50° C. below the melting temperature of the metal deposited in step b. The pressure exerted on the zones to be bonded is about 0.1 Newtons per square millimeter ($N/mm^2$).

An example of the device of the invention is described below in greater detail. It constitutes a heat pipe 50. It has a bottom sheet 2, three intermediate sheets 3, and a top sheet 4.

As shown in FIG. 2, the bottom sheet 2 is elongate in shape. Its overall size is 215 mm in length, 69 mm in width, and 0.25 mm in thickness. It has zones etched down from the first level 7 to the second level 8. The distance between the first and second levels 7 and 8 is 70 $\mu$m. The width of these zones is approximately 1 mm. A metal 15 is deposited on the first level 7 at the periphery of the sheet and along lines that are equidistant, parallel, and generally longitudinal. Four holes 10 are etched through the thickness of the bottom sheet 2 outside the line formed by the deposit 15, at the periphery of the sheet.

Figure 3:
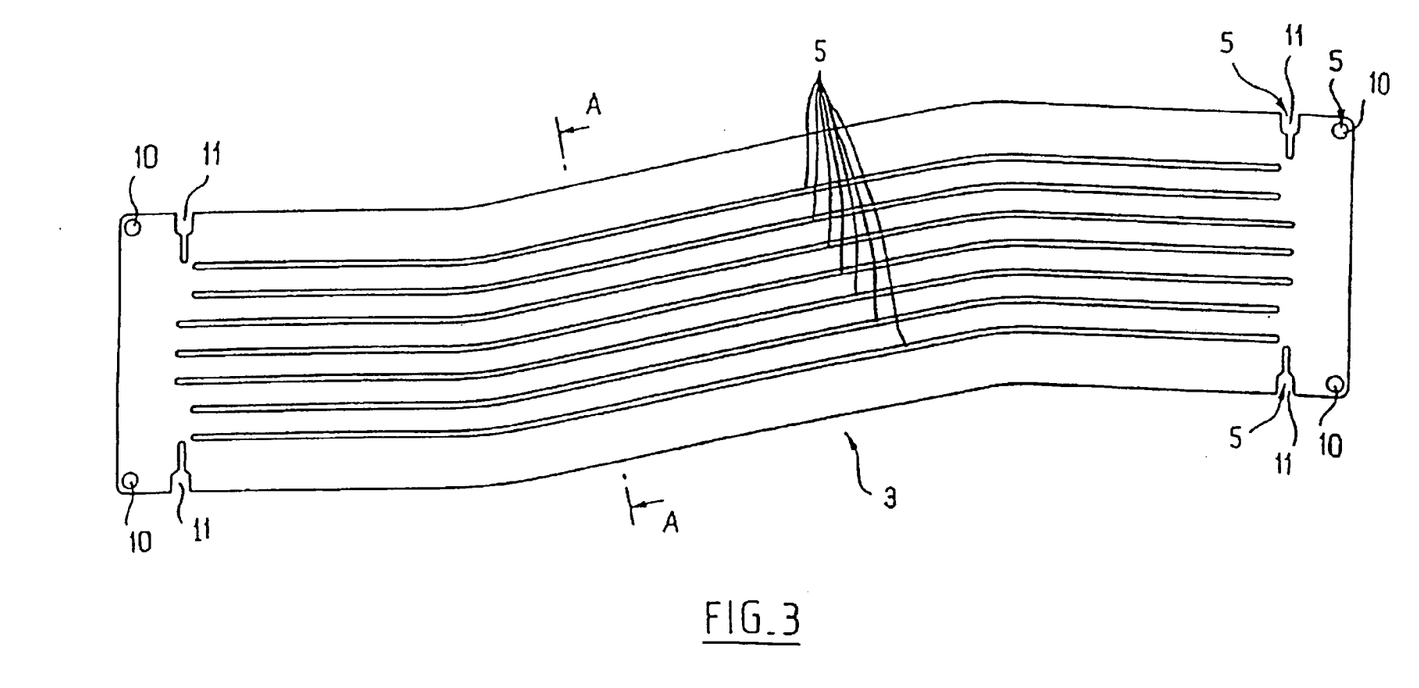
FIG. 3 is an elevation view of the bottom of an intermediate sheet of the device of the invention that corresponds to the same embodiment as that of FIG. 2.

As shown in FIGS. 3 and 4, the intermediate sheets 3 have the same shape as the bottom sheet 2. They also have outside dimensions of 215 mm in length and 69 mm in width, but they are 200 $\mu$m thick.

As shown in FIG. 3, an intermediate sheet has zones 5 that are etched through its entire thickness. These zones are situated at the longitudinal ends thereof to form the holes 10 at the ends of its longitudinal edges, to form the notches 11, and to form lines that are equidistant, parallel, and generally longitudinal. There are seven of these lines which are to form gas transport channels 6. The three middle-most lines are longer than the others and extend further into the zone situated between the two notches 11 in the two opposite longitudinally-extending edges of the intermediate sheet 3. All of these lines open out at each end to a zone extending transversely thereto and etched from the first level 7 down to the second level 8. Thus, these zones etched from the first level 7 to the second level 8 define capillary zones which, when immersed in the liquid phase of the fluid condensed at this level, serve to redistribute the liquid amongst all of the capillary channels 9.

As shown in FIG. 4, an intermediate sheet 3 also has zones etched down from the first level 7 to the second level 8. The distance between the first and second levels 7 and 8 is 70 μm. Around each zone 5 etched through the entire thickness and defining a gas transport channel 6, zones are etched down to the second level 8, while at the periphery and between the channels 6, zones are left that are not etched at the first level 7. The zones that are etched to the second level 8 communicate with one another and with the notches 11.

The metal 15 is deposited at the periphery of the sheet and along generally longitudinal lines on the first level 7 in the same pattern as the pattern in which the metal 15 is deposited on the bottom sheet 2.

Figure 5:
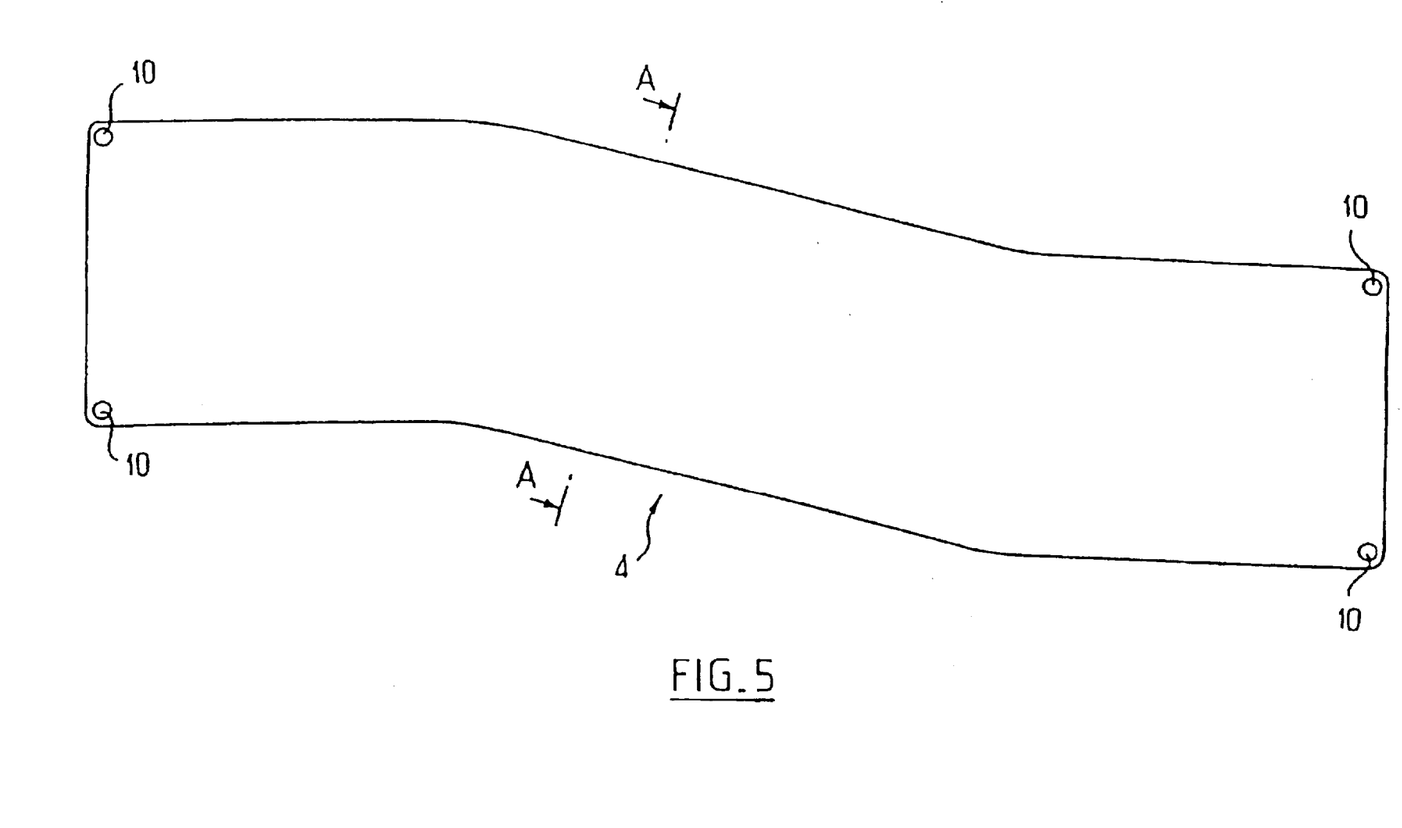
FIG. 5 is an elevation view of the top of a top sheet of the device of the invention corresponding to the same embodiment as FIG. 2.

As shown in FIG. 5, a top sheet 4 is of an elongate shape identical to that of the bottom sheet 2 and of the intermediate sheets 3. Its overall length and width are identical to those of the bottom sheets 2 and of the intermediate sheets 3. It is 200 μm thick. It has two holes 10 at each of its longitudinal ends.

Figure 6:
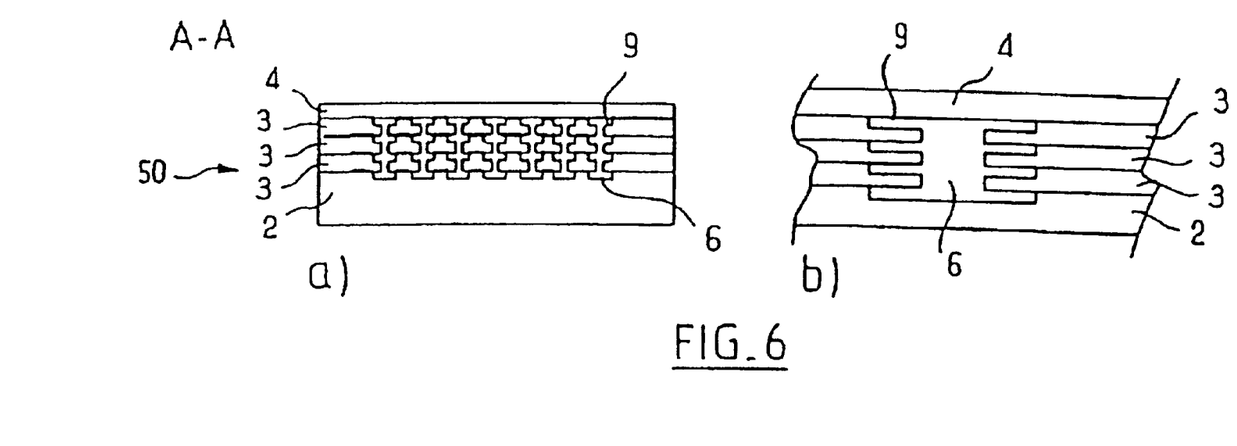
FIG. 6 is a diagrammatic section view on line A—A through a stack of the sheets shown in FIGS. 2, 3, 4, and 5.

A bottom sheet 2, three intermediate sheets 3, and a top sheet 4 are stacked, e.g. using the method described above, so as to form a heat pipe 50 whose thickness is about 1 millimeter (FIG. 6a). The heat pipe 50 has seven gas transport channels 6. Eight capillary channels 8 open out to each gas transport channel 6 (FIG. 6b), giving a total of 56 capillary channels 9. Each capillary channel 9 has a section of about 70 μm by 1 mm. The dimensions of the stacked structure shown diagrammatically in FIG. 6 are not to scale. In particular, FIG. 6 has its scale greatly expanded in the direction perpendicular to the plane of the sheets so as to show up the capillary channels 9. Nevertheless, if three intermediate sheets 3 of 0.2 mm thickness are used having etched zones 5 through their entire thickness of a width of 1 mm and a bottom sheet 2 with furrows etched therein to a depth of 70 μm and a width of 3 mm, and if these sheets are stacked so as to put the etched zones in register, then seven gas transport channels are obtained having a section that is 1 mm wide and 0.6 mm thick.

As shown in FIG. 7, the heat pipe 50 is provided with pips 13 and with plugs 14 and it is placed on a jig 16 and covered by a sheet 17. The jig 16 is constituted by a plate that is 220 mm long, 76 mm wide, and 10 mm thick. The sheet 17 has overall length and width that are respectively 219 mm and 73 mm. It is 1 mm thick.

The heat pipe 50 is held on the jig 16 together with the sheet 17 by pegs 12. It is loaded by weights that are isolated from the sheet 17 by means of alumina spacers which make it possible to avoid bonding the weights to the sheet 17. Other variants of the device of the invention can be envisaged. For example, such a device could have more intermediate sheet 3. For example, the total number of sheets stacked to form a heat pipe 50 could be ten or 20. Similarly, the capillary channels 9 for transporting the liquid phase of the fluid by capillarity and the gas transport channels 6 can be made in different ways. For example, a heat pipe 50 is described above having a capillary channel 9 situated on each side of each zone 5 that is etched through the thickness of the sheets. However, a single capillary channel 9 could be provided on one side only of each zone 5 etched through the entire thickness. It is also possible to superpose a plurality of heat pipes 50 on one another.

The devices described above comprise sheets of metal, but it would not go beyond the spirit of the invention to use sheets made of a plastics material, a composite, etc. The material for bonding them together should then be selected accordingly. It could be a polymer adhesive, for example. It is even possible to envisaged welding the sheets together, by local melting and without any filler material.

Devices of the invention are described above in which the capillary channels 9 are formed by chemically etching grooves in a sheet. However, it is also possible to envisage making such grooves by depositing an extra thickness of material on sheets.

Devices of the invention have numerous applications in controlling heat in space, in aviation, in electronics, in computing, etc.

The methods implemented in the method described above, in particular deposition by electrotyping and chemical etching make it possible to implement all sorts of shapes with complex arrays of channels, but without increasing the number of manufacturing steps. Regardless of the number of sheets in a device of the invention, only a single bonding step needs to be performed.

Furthermore, a device of the invention is easily integrated in electronic circuits 20, both because of its shape and because of the type of method used to make it.

Figure 8:
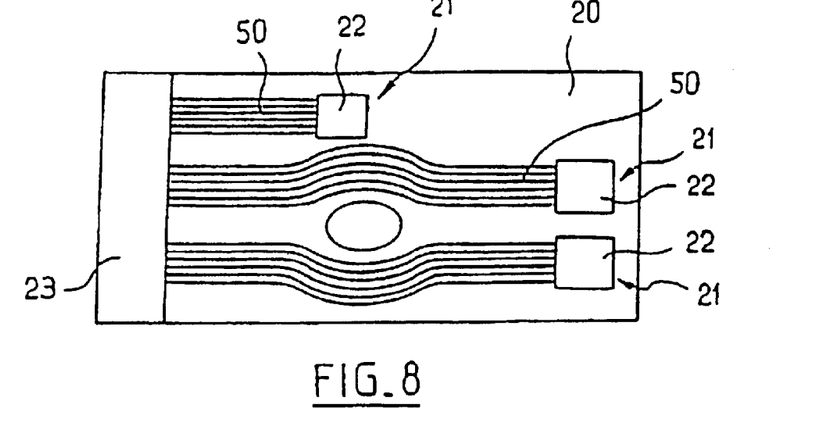
FIG. 8 is a diagrammatic plan view showing an application of a device of the invention to cooling components on electronic circuits.

As shown in FIG. 8, heat pipes 50 placed on electronic circuits 20 enable hot zones 21 that carry heat-generating components 22 to be cooled, with the heat being taken to dumping zones 23, even if it is necessary to bypass orifices or other components 22.

Figure 9:
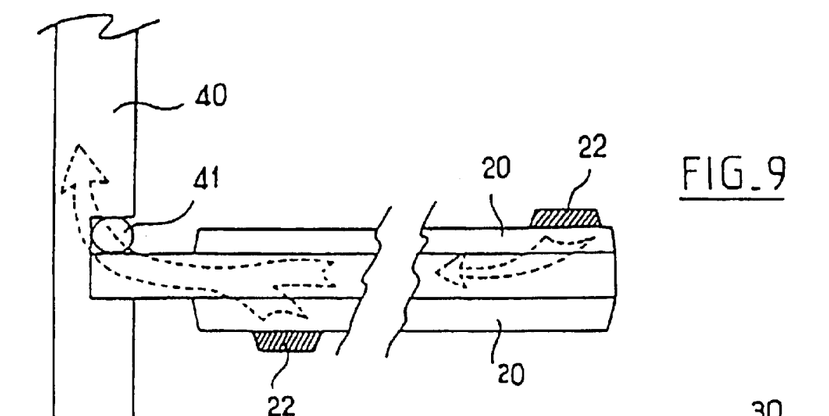
FIG. 9 is a diagrammatic longitudinal section of a device of the invention sandwiched between two printed circuits.

As shown in FIG. 9, an epoxy resin printed circuit 20 can be stuck flat onto each of the main faces of a heat pipe 50 so that the heat pipe is sandwiched therebetween. Thus, the gas transport channels 6 and the capillary channels 9 of the heat pipe 50 transfer heat directly from zones of the printed circuit 20 carrying components 22 that need to be cooled to a heat exchange rack 40 or to a radiator. A thermal clamp 41 ensures that heat is conducted between the heat pipe 50 and the rack 40 or the radiator. The heat pipe 50 in this case thus acts as a support for the printed circuit 20 as well as serving to conduct heat. Using a structure analogous to that described in detail above, and having a thickness of less than 3 mm, it is possible to evacuate about 10 watts per square centimeter (W/cm$^2$) over at least 5 square centimeters (cm$^2$).

Figure 10:
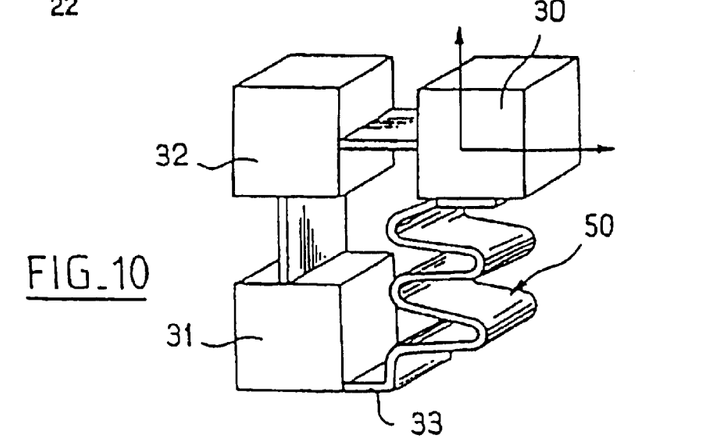
FIG. 10 is a diagram showing an example of a device of the invention in use for cooling a detector.

As mentioned above, the small thickness of devices of the invention makes it possible to deform them for certain applications. Thus, as shown in FIG. 10, a heat pipe 50 can be given a bellows shape, e.g. to cool a moving detector 30. It suffices to place the bellows in such a manner as to have its folds extending perpendicularly to the plane in which movement generated by a vertical displacement device 31 takes place and in which movement generated by a horizontal displacement device 32 also takes place, with the heat pipe 50 connecting the detector 30 to a heat dumping element 33. Tests performed with a device of the invention of the type shown in FIG. 1, i.e. having four layers on its base, have shown that the heat pipe effect could be obtained with good efficiency only by accepting a high temperature difference between the hot source and the cold source, in particular for transferring heat at a high rate.

Analysis of the heat exchange mechanisms, as confirmed by digital simulation, has shown that the temperature differential is essentially made up of three components:

a temperature gradient between the surface of the device at the hot source and the evaporation surface (=46% of the total);

a temperature differential between the evaporation surface and the condensation surface (=8%); and a temperature gradient between the condensation surface and the surface of the device at the cold source (=46% of the total)

The magnitude of the first and third components is a consequence of the poor thermal conductivity of the fluid and of the concentration of the heat flux in the vicinity of the boundary between the capillary channels 9 and the gas transport channels 6. The second component is the only component which is fundamentally associated with the physical process that generates the operation of the device of the invention when it operates as a heat pipe.

In order to reduce the harmful effects of the first and third components, the section of the capillary channels 9 can be modified as described below. In cross section, a capillary channel 9 is generally U-shaped, having two side walls 25 that are parallel and that correspond to the branches of the U-shape, and an end wall 26. The end wall 26 is perpendicular to the side walls 25 between which it extends. Thus, each side wall 25 has a longitudinal edge connected to the end wall 26 and a free longitudinal edge 27 or 28 which is parallel to the previously-mentioned edge.

Figure 11:
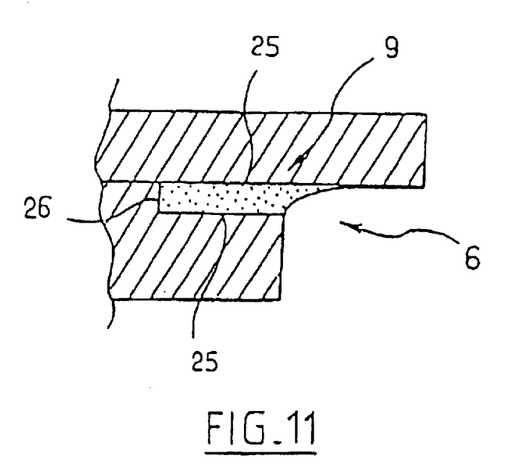
FIG. 11 is a diagrammatic cross-section of a capillary in a variant of the device shown in FIG. 6.

As can be understood from FIG. 11, the greater the offset between the free edges 27 and 28 the larger the meniscus separating the liquid phase from the gas phase and the greater the wetted area. This meniscus area corresponds to a greater evaporation surface area S.

The heat flow F is defined as follows:

$$F = \frac{P_{th}}{S}$$

where $P_{th}$ is the heat power delivered to the fluid in the capillary channel 9.

This makes it possible to obtain the following relationship between the flux S, the thermal conduction λ of the fluid in the capillary channel 9, and the temperature gradient Δθ between the walls 25 and 26 of the capillary channel 9 and the evaporation area S:

$$F = \frac{P_{th}}{S} = \frac{\lambda S}{e}\Delta\theta$$

where e is the thickness of the fluid providing thermal conduction (the thickness e is equal to half the width of the capillary channel 9 inside the channel and it decreases on getting further from the end wall 26 when going from one free edge towards the other).

This relationship can also be written:

$$\Delta\theta = \frac{1}{\lambda}\frac{e}{S^2}P_{th}$$

It will thus be observed that reducing the thickness e and/or increasing the evaporation area S (which is a squared term) will lead to a significant reduction in Δθ.

Similarly, by increasing the condensation area, by offsetting the longitudinal free edges 27 and 28 adjacent to the cold source of the device of the invention, it is possible to reduce the temperature gradient between the condensation surface and the walls 25, 26 of the capillary channel 9.

By increasing the areas of the evaporation surface S and the condensation surface, it is possible to reduce the first and third components mentioned above in the temperature differential between the hot source and the cold source by reducing the flux concentration in the vicinity of the boundary between the capillary channel 9 and the gas transport channel 6.

This makes it possible to obtain a proportional increase in the temperature differential between the evaporation surface S and the condensation surface, i.e. the second component mentioned above. Consequently, the performance of the device of the invention is improved thereby.

Similarly, the various capillary channels 9 can all have dimensions that are identical. However, in an advantageous variant, they can have dimensions that are different, e.g. for the particular purpose of optimizing heat conduction to the vaporization zones where the evaporation surfaces S are situated.

In practice, the offset between the free longitudinally-extending edges 27 and 28 can vary or can be constant over the length of the capillary channel 9.

In a device of the present invention, constituted by a plurality of intermediate sheets 3, it is advantageous to minimize heat conduction paths through the bulk of the bottom sheet 2, the intermediate sheets 3, and the top sheet 4 between the face of the bottom sheet 2 or the face of the top sheet 4 and the side and end walls 25 and 26 of each capillary channel 9.

Figure 12:
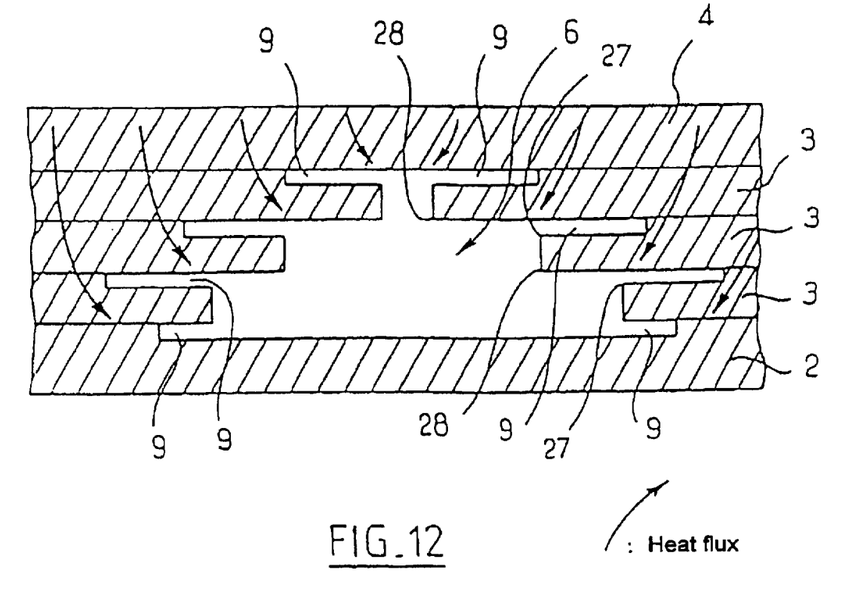
FIG. 12 is a diagrammatic cross-section of a gas transport channel surrounded by its associated capillary channels in a variant of the device shown in FIG. 6.

FIG. 12 shows a disposition and a stack of the sheets 2, 3, and 4 suitable for forming a gas transport channel 6 that has a cross-section which is generally triangular, with the longitudinally-extending free edges 27 and 28 in a staircase configuration constituting a configuration that minimizes the above-mentioned heat conduction paths.

Furthermore, at the cold source end, there is another possible advantageous variant for the device of the invention. The systems for collecting and transferring heat that act as heat sinks generally enable heat to be removed only in the form of a heat flow that is very low through the heat exchange surface between the device and such heat collecting and transferring systems. Thus, in order to increase the heat power exchanged, it is necessary to increase the heat exchange area.

This can be achieved, for example, by increasing the number of ducts 51 in the vicinity of the cold source, where each duct is constituted by a gas transport channel 6 and its associated capillary channels 9.

Figure 13:
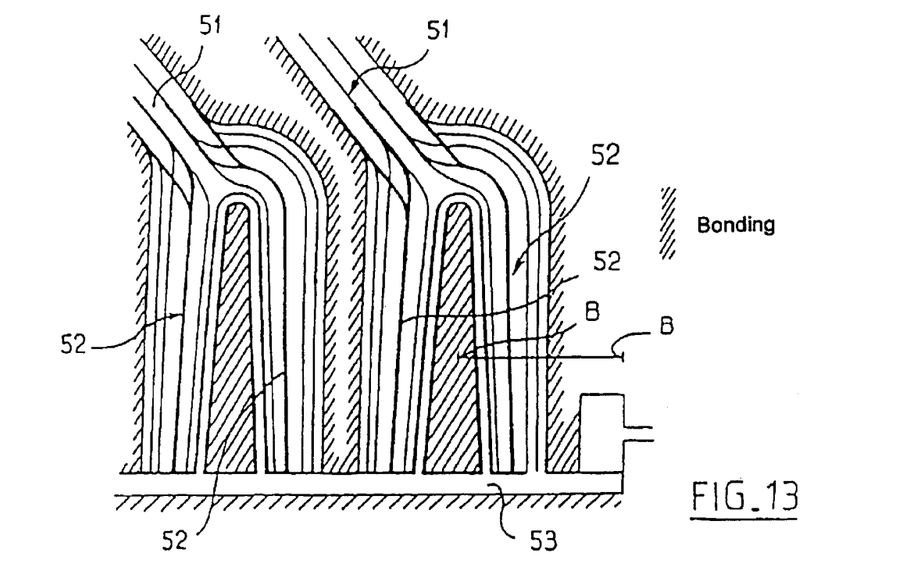
FIG. 13 is a plan view in transparency on a plane parallel to the main plane and showing a condenser forming portion of a variant of the device corresponding to the embodiment shown in FIGS. 2 to 6.

FIG. 13 shows an example where two such ducts 51 are split in two. In this example, each duct 51 is split close to the cold source into two ramifications 52. Each of these two ramifications 52 opens out to a manifold 53 that interconnects all of the ramifications 52 from all of the ducts 51 in the vicinity of the cold source. The set of ramifications 52 opening out into a duct 51 must have a total capillary channel section that is sufficient to enable all of the condensed fluid to return by capillarity from the cold source to the hot source in the various capillary channels 9 of the ducts 51 situated between these two sources. Typically, the total section of the various capillary channels 9 and the various ramifications 52 opening out into a duct 51 is equal to that of all of the capillary channels 9 of said duct 51.

The set of ramifications 52 constitutes a condenser.

Figure 14:
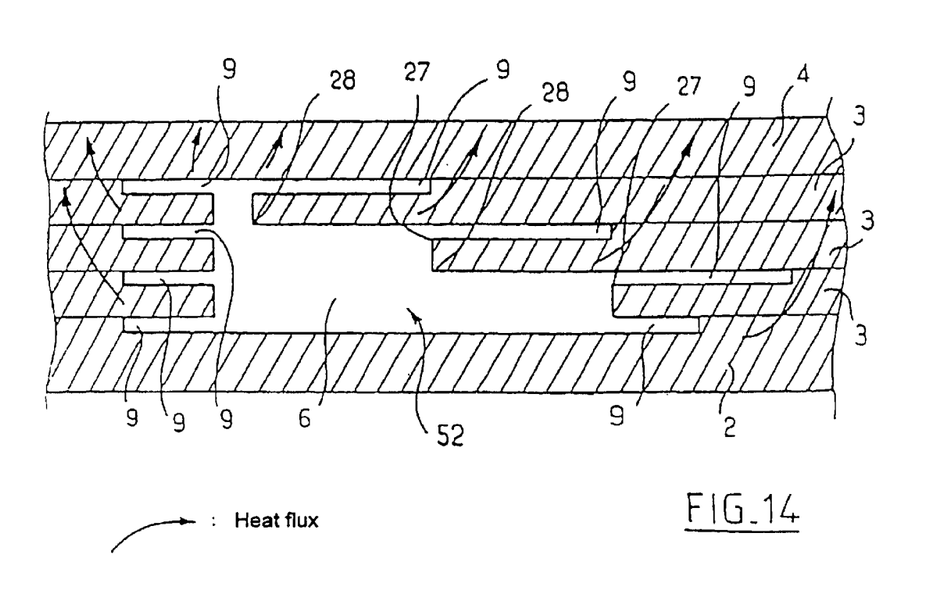
FIG. 14 is a diagrammatic cross-section on line B—B of FIG. 13 showing a ramification situated in the condenser-forming portion shown in FIG. 13.

As shown in FIG. 14, the capillary channels 9 of each ramification are advantageously superposed on one another in such a manner that the longitudinal free edges 26 and 27 are offset relative to one another in the manner described above so as to increase the condensation area. As also shown in FIG. 14, a disposition and stack of sheets 2, 3, and 4 suitable for forming a triangular gas transport channel 6 in the vicinity of the ramifications 52 constitutes an advantageous configuration making it possible to minimize the above mentioned heat conduction paths. As represented by arrows in this figure, the conduction of heat is widely spread out.

Furthermore, in order for a device of the invention to operate properly, it is necessary to fill it accurately with its heat conveying fluid. Specifically:

if it is not filled sufficiently, then a portion of the capillary channels 9 will be dry, and given the principle on which the device of the invention operates, this drying out will take place in the portion of the device of the invention that acts as an evaporator, which would make the device inoperative; however if the device is overfilled, then a portion of the gas transport channels 6 would be invaded with excess fluid and, on the same principle, the excess would be located in the portion of the device of the invention that acts as the condenser, which would likewise prevent it from operating.

The volume of the capillary portion is of the same order of magnitude as the volume corresponding to the gas transport channels 6. The fluid is filled in a "vacuum", i.e. under saturated vapor pressure only. This encourages bubbles of vapor to appear more or less throughout the filling circuit. It is therefore very difficult to handle small quantities of the liquid phase of the heat-conveying fluid. Consequently, filling is performed with accuracy of no better than plus-or-minus ten percent, relative to the intended quantity of liquid fluid. This remains insufficient to avoid the above mentioned problems.

To obtain proper operation of the device of the invention in spite of this inaccuracy concerning filling quantities, the Applicant proposes providing at least one reservoir 54 of a volume that is comparable to that of a gas transport channel 6 and into which the capillary channels 9 open out, thereby putting the reservoir into communication with the remainder of the device of the invention.

Preferably, the overall volume of the reservoir(s) 54 is approximately equal to twenty percent of the quantity of liquid fluid intended for filling the device of the invention, i.e. approximately twenty percent of the capillary volume of the device of the invention. The reservoir 54 thus constitutes not only a supply but is also capable of collecting excess fluid.

Each reservoir 54 needs to be situated in the cold portion of the device of the invention. However it should not be situated at the coldest point since under such circumstances it would contribute to reducing the capillary pressure returning liquid fluid from the portion of the device of the invention that forms the condenser towards its portion forming the evaporator.

Figure 15:
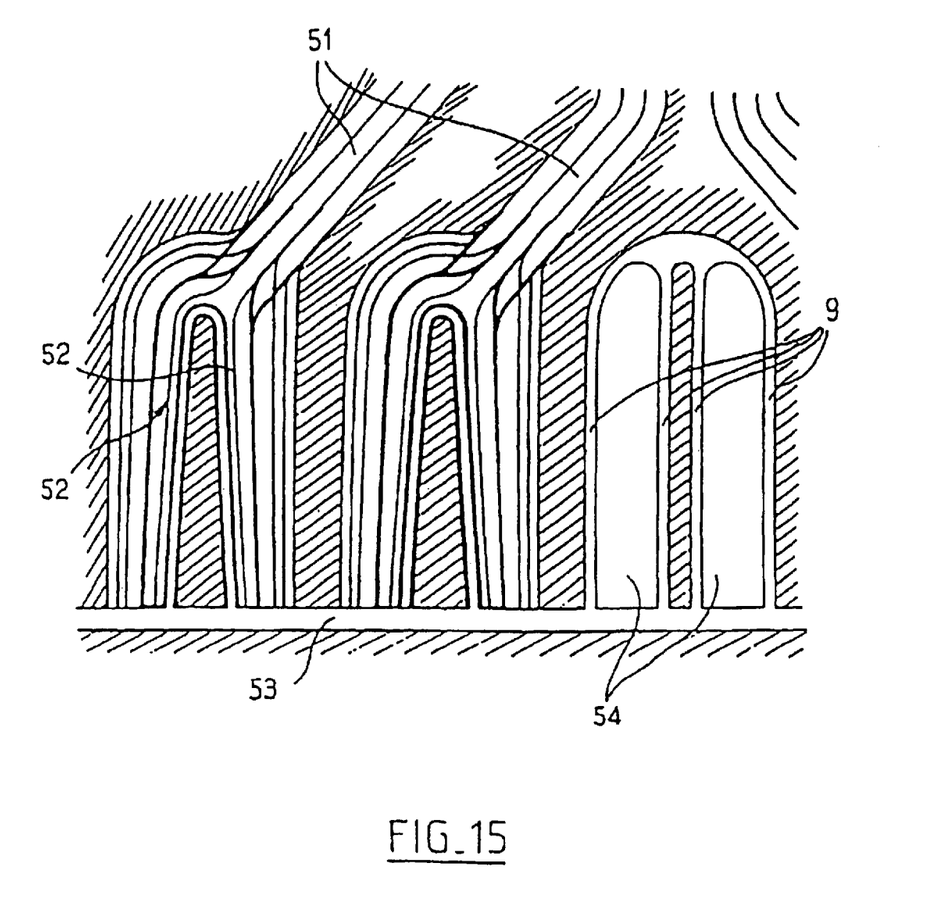
FIG. 15 is a plan view in transparency on a plane parallel to the main plane and showing a reservoir-forming portion of a variant of the device corresponding to the embodiment shown in FIGS. 2 to 6.

A satisfactory disposition consists in placing each reservoir 54 amongst the ramifications 52 of the condenser. In this situation, each reservoir 54 is kept cold by the device of the invention being in contact with the external cold source. Since it is not heated by gas circulation, it is colder than the ramifications 52 of the condenser. However, since it is in the vicinity thereof, it is heated by them and cannot be much colder. FIG. 15 shows such a disposition. In this disposition, a set of two reservoirs 54 is situated between two sets of two ramifications 52. Each reservoir 54 is surrounded by a zone of capillary channels 9 opening out to the manifold 53 which communicates with all four ramifications 52.

Thus, a device of the invention has a sheet structure which enables it to be flat. This shape also makes it possible to have large contact areas between the device and the structures which are fitted with the device. Heat exchange between the device and such structures is facilitated thereby.

Preferably each sheet of the flat device according to the invention has a thickness which is less or equal to 500 $\mu$m, a length which is superior or equal to 50 times thickness and a width which is superior or equal to 20 times its thickness. Therefore, in one embodiment, the device according to the present invention, has a thickness which is between 1 and 2 mm. Preferably, the device according to the present invention has a length which is between 50 and 200 mm. In another embodiment according to the invention, the device has a width which is between 10 and 30 mm. Therefore, the device according to the present invention has a flat structure.

What is claimed is:

1. A flat sheet structured thermal device using a two-phase active fluid, wherein the device comprises at least four sheets (2, 3, 4) comprising a top sheet (4), at least two intermediary sheets (3), and a back sheet (2) stacked longitudinally on top of one another, wherein each intermediary sheets (3) has at least one zone etched through its entire thickness in order to contribute to the formation of at least one gas transport channel (6), the etched zone being longitudinally bordered by at least one groove formed on the same sheet, said at least one groove contributing to the formation of at least one capillary channel (9) when said sheet (3) is covered by another sheet (3, 4), said at least one capillary channel (9) communicating longitudinally over its entire length with said at least one gas transport channel (6), wherein said at least one capillary channel (9) is of a section adapted to enable the liquid phase of the fluid to be pumped therein by capillary forces; wherein the at least one gas transport channel (6) has a section greater than that of said at least one capillary channel (9), and wherein said device allows fluid to pass reversibly between said at least one capillary channel (9) and said at least one gas transport channel (6) during the liquid/gas or gas/liquid transition due to temperature variations to which at least one zone of the device (50) is subjected.

2. The thermal device according to claim 1, characterized in that said at least one capillary channel (9) is less than approximately 100 $\mu$m, in size perpendicularly to a main surface of the sheet (3) with which said groove constituting it is flush.

3. The thermal device according to claim 2, characterized in that said at least one capillary channel (9) has a size perpendicularly to a main surface of the sheet (3) with which said groove constituting it is flush that lies in the range 50 $\mu$m to 70 $\mu$m, approximately.

4. The thermal device according to claim 3, characterized in that said at least four sheets (2, 3, 4) are made of copper, nickel, iron, or aluminum, or alloys thereof.

5. The thermal device according to claim 4, further comprising at least one circuit channel (6, 9) operating in a closed circuit and, without requiring a motor, serving to circulate the fluid contained in the circuit between an evaporation zone and a condensation zone, the capillary forces exerted on the liquid phase of the fluid contained in said at least one capillary channel (9) acting as a pump on the fluid.

6. A device according to claim 5, characterized in that it is made up of a plurality of sheet subassemblies (2, 3, 4), each subassembly comprising a circuit of channels (6, 9) that is isolated from the circuit of each other subassembly, each circuit being filled with a fluid whose thermodynamic properties enable the fluid to operate over different temperature ranges.

7. The thermal device according to claim 4, further comprising at least one circuit of channels (6, 9) open to a circuit including a pump and a condenser, the thermal device acting as an evaporator and the capillary forces exerted on the liquid phase of the fluid enabling it to be fixed within said at least one capillary channel (9) and enabling it to be distributed by capillary pumping.

8. The thermal device according to claim 7, further including a capillary channel (9) of generally U-shape having two parallel side walls (25) corresponding to branches of the U-shape and an end wall (26), each side wall (25) having a longitudinal edge connected to an end wall (26) and free longitudinal edges (27, 28) parallel to said longitudinal edge of each side wall (25), each of said free longitudinal edges (27, 28) being offset relative to each other.

9. The thermal device according to claim 8, characterized by the fact that the sheets (2, 3, 4) are disposed and stacked in such a manner as to form a gas transport channel (6) whose cross-section is generally triangular, with said free longitudinal edges (27, 28) being in a staircase configuration so as to minimize heat conduction paths.

10. The thermal device according to claim 9, characterized by the fact that it includes a duct (51) constituted by said at least one gas transport channel (6) and said at least one capillary channel (9) that splits into two ramifications (52).

11. The thermal device according to claim 10, characterized by the fact that it includes a reservoir (54) situated in a cold portion of said thermal device to constitute a reserve of fluid or to collect excess fluid.

12. A method of manufacturing two-phase fluid heat exchanger devices in which at least four sheets (2, 3, 4) comprising a top sheet (4), at least two intermediary sheets (3) and a back sheet (2) are stacked longitudinally on top of one another, the method comprising:

etching each intermediary sheet (3) in a zone through its entire thickness, said zone being designed to contribute to the formation of a gas transport channel (6);

forming a groove that longitudinally borders said zone etched through its entire thickness; and covering the face of the sheet (3) on which said groove is found by another sheet (3, 4) in order to form a capillary channel (9).

13. The method according to claim 12, said groove and each zone etched through the entire thickness of said sheet (3) are etched chemically.

14. The method according to claim 13, further including: assembling the sheets by soldering under a non-oxidizing atmosphere.

15. The method according to claim 14, further including:

depositing a bonding material in strips to provide leak-proof bonding between sheets (2, 3, 4) with longitudinal separation between gas channels (6), while nevertheless maintaining communication between gas channels (6) at the ends thereof.

16. The method according to claim 15, said bonding material is a metal whose melting point is lower than that of the metal constituting the sheets (2, 3, 4).

17. The method according to claim 16, said bonding material is deposited by electrotyping, in a pattern defined by a mask.

18. The method according to claim 15, said bonding material is deposited by electrotyping, in a pattern defined by a mask.

19. The method according to claim 13, further including:

depositing a bonding material in strips to provide leak-proof bonding between sheets (2, 3, 4) with longitudinal separation between gas channels (6), while nevertheless maintaining communication between gas channels (6) at the ends thereof.

20. The method according to claim 19, said bonding material is a metal whose melting point is lower than that of the metal constituting the sheets (2, 3, 4).

21. The method according to claim 19, said bonding material is deposited by electrotyping, in a pattern defined by a mask.

22. The method according to claim 20, said bonding material is deposited by electrotyping, in a pattern defined by a mask.

\* \* \* \* \*